(12) United States Patent
McDermott et al.

(10) Patent No.: US 12,414,483 B2
(45) Date of Patent: Sep. 9, 2025

(54) FABRICATION OF NORMAL CONDUCTING OR LOW-GAP ISLANDS FOR DOWNCONVERSION OF PAIR-BREAKING PHONONS IN SUPERCONDUCTING QUANTUM CIRCUITS

(71) Applicants: WISCONSIN ALUMNI RESEARCH FOUNDATION, Madison, WI (US); Syracuse University, Syracuse, NY (US)

(72) Inventors: Robert McDermott, Madison, WI (US); Britton Plourde, Jamesville, NY (US)

(73) Assignees: WISCONSIN ALUMNI RESEARCH FOUNDATION, Madison, WI (US); SYRACUSE UNIVERSITY, Syracuse, NY (US)

( * ) Notice: Subject to any disclaimer, the term of this patent is extended or adjusted under 35 U.S.C. 154(b) by 898 days.

(21) Appl. No.: 17/469,380

(22) Filed: Sep. 8, 2021

(65) Prior Publication Data

US 2023/0077178 A1   Mar. 9, 2023

(51) Int. Cl.
*H10N 69/00* (2023.01)
*G06N 10/40* (2022.01)
*H10N 60/01* (2023.01)
*H10N 60/12* (2023.01)

(52) U.S. Cl.
CPC .............. *H10N 69/00* (2023.02); *G06N 10/40* (2022.01); *H10N 60/0912* (2023.02); *H10N 60/12* (2023.02)

(58) Field of Classification Search
CPC ....... H10N 69/00; H10N 60/815; G06N 10/40
See application file for complete search history.

(56) References Cited

U.S. PATENT DOCUMENTS

| | | | |
|---|---|---|---|
| 10,505,096 B1 * | 12/2019 | Rosenblatt | ............ H10N 60/12 |
| 10,998,486 B1 | 5/2021 | Martinis | |
| 2023/0077178 A1 | 3/2023 | McDermott et al. | |

FOREIGN PATENT DOCUMENTS

WO   2011018478 A1   2/2011

OTHER PUBLICATIONS

Christensen et al., "Anomalous charge noise in superconducting qubits", Phys. Rev. B 100, 140503 (R)(2019).
Fowler et al., Surface codes: Towards practical large-scale quantum computation, Phys. Rev. A 86, 032324 (2012).
International Search Report and Written Opinion for corresponding International Application No. PCT/US2022/042947, mailed May 9, 2023.
Krupka et al., "Dielectric properties of semi-insulating silicon at microwave frequencies", Appl. Phys. Lett. 107, 082105 (2015).
(Continued)

*Primary Examiner* — Matthew L Reames
(74) *Attorney, Agent, or Firm* — Quarles & Brady, LLP

(57) ABSTRACT

Disclosed herein is a quantum processor comprising a substrate, a qubit structure formed on the substrate, an electroplated phonon downconversion material, and furrows through the electroplated phonon downconversion material forming a plurality of electroplated phonon downconversion islands coupled to the substrate configured to channel deposited energy away from the qubit structure. Also disclosed are methods of making and using the same.

6 Claims, 4 Drawing Sheets

(56) References Cited

OTHER PUBLICATIONS

Martinis, "Saving superconducting quantum processors from decay and correlated errors generated by gamma and cosmic rays", npj Quantum Information (2021) 90.

Patel et al., "Phonon-mediated quasiparticle poisoning of superconducting microwave resonators", Phys. Rev. B 96, 220501(R) (2017).

Rafferty et al., "Spurious Antenna Modes of the Transmon Qubit", arXiv:2103.06803 (2021).

Riste et al., "Millisecond charge-parity fluctuations and induced decoherence in a superconducting transmon qubit", Nat. Comm. 4, 1913 (2013).

Serniak et al., "Hot Nonequilibrium Quasiparticles in Transmon Qubits", Phys. Rev. Lett. 121, 157701 (2018).

Shutt et al., "Simultaneous high resolution meausurement of phonons and ionization created by particle interactions in a 60 g germanium crystal at 25 mK", Physical Review Letters, 69(24), 3531-3534. https://doi.org/10.1103/PhysRevLett.69.3531, 1992.

Wang et al., "Measurement and control of quasiparticle dynamics in a superconducting qubit", Nat. Commun. 5, 5836 (2014).

Wilen et al., "Correlated Charge Noise and Relaxation Errors in Superconducting Qubits", arXiv:2012.06029 (2020).

Iaia V et al: "Phonon downconversion to suppress correlated errors in superconducting qubits", arxiv.org, Cornell University Library, 201 Olin Library Cornell University Ithaca, NY 14853, Mar. 13, 2022.

Pan Y et al: "Effect of a Cu seed layer on electroplated Cu film", Microelectronic Engineering, Elsevier Publishers BV., Amsterdam, NL, vol. 105, Jan. 5, 2013 (Jan. 5, 2013).

* cited by examiner

FABRICATION OF NORMAL CONDUCTING OR LOW-GAP ISLANDS FOR DOWNCONVERSION OF PAIR-BREAKING PHONONS IN SUPERCONDUCTING QUANTUM CIRCUITS

STATEMENT REGARDING FEDERALLY SPONSORED RESEARCH

This invention was made with government support under W911NF-18-1-0106 awarded by the ARMY/ARO. The government has certain rights in the invention.

BACKGROUND OF THE INVENTION

Current approaches to quantum error correction rely on large-scale networks of interacting qubits to uniquely identify errors in the array. Robust error correction has two requirements: the error rate must be below the fault tolerant threshold, and errors must be uncorrelated. Fluctuating offset charge in superconducting qubit arrays is highly correlated on length scales of order hundreds of microns. Discrete changes in offset charge are accompanied by a strong transient suppression of qubit $T_1$ across the millimeter-scale chip. The correlated dephasing and relaxation errors are explained in terms of absorption in the qubit substrate of high-energy particles, namely, cosmic ray muons and gamma-rays due to low-level radioactivity. Accordingly, there is a need for devices and methods for downconversion of pair-breaking phonons in superconducting quantum circuits.

BRIEF SUMMARY OF THE INVENTION

Disclosed herein is a quantum processor comprising a substrate, a qubit structure formed on the substrate, an electroplated phonon downconversion material, and furrows through the electroplated phonon downconversion material forming a plurality of electroplated phonon downconversion islands coupled to the substrate configured to channel deposited energy away from the qubit structure. Also disclosed are methods of making and using the same. In some embodiments, the furrows are formed by mechanical furrowing through the electroplated phonon downconversion material. In some embodiments, the quantum processor further comprises a seed layer positioned between the substrate and the electroplated phonon downconversion material.

Another aspect of the invention provides for an article for fabricating a quantum processor. The article may comprise a substrate, the substrate having a qubit structure formed thereon or configured for fabrication of a qubit structure thereon, an electroplated phonon downconversion material, and a furrowing protective layer deposited on the substrate, or the qubit structure formed thereon, and the electroplated phonon downconversion material.

Another aspect of the invention provides for a method for fabricating a quantum processor where the method may comprise mechanically furrowing through the electroplated phonon downconversion material to form a plurality of electroplated phonon downconversion islands coupled to the substrate configured to channel deposited energy away from the qubit structure.

Another aspect of the invention provides for a method for fabricating a quantum processor where the method may comprise applying electrical current to a substrate, the substrate having a qubit structure formed thereon or configured for fabrication of a qubit structure thereon, in contact with an electrolyte, the electrolyte comprising a phonon downconversion material precursor, under conditions sufficient to electroplate phonon downconversion material onto the substrate.

These and other aspects of the invention will be further described herein.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention.

DETAILED DESCRIPTION OF THE INVENTION

Figure 1:
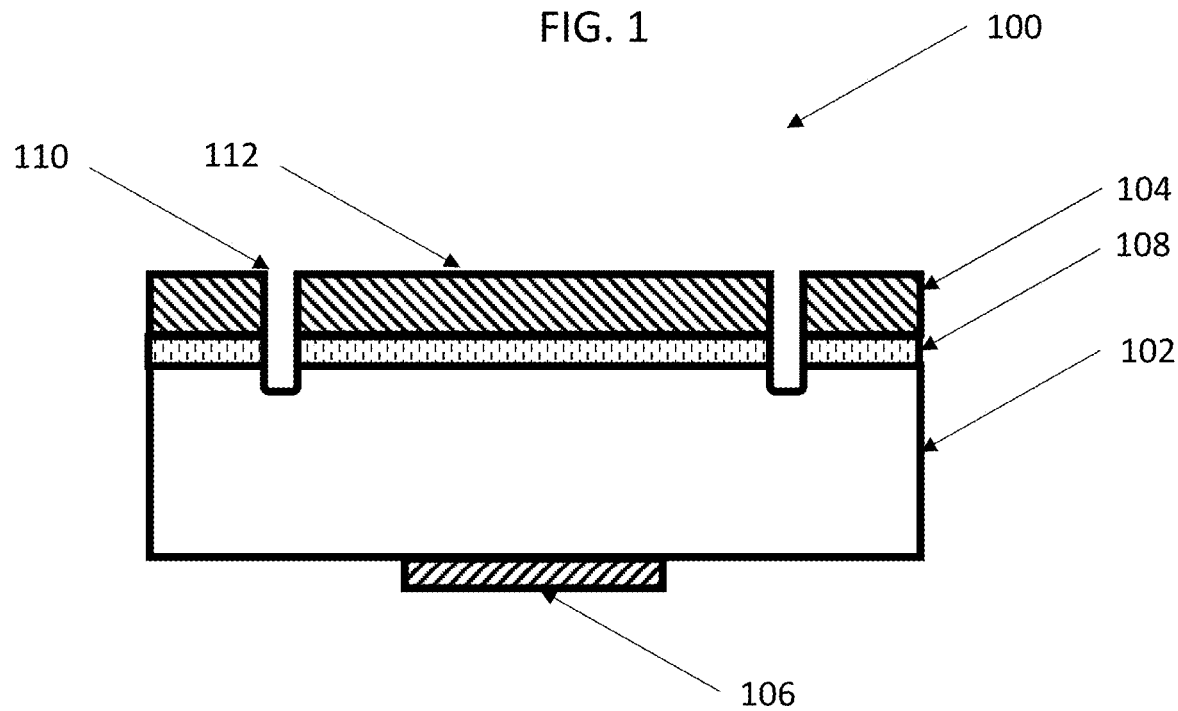
FIG. 1 illustrates an exemplary quantum processor comprising furrows through an electroplated phonon downconversion material forming a plurality of electroplated phonon downconversion islands coupled to the substrate configured to channel deposited energy away from the qubit structure.

Disclosed herein are devices and methods for downconversion of pair-breaking phonons in superconducting quantum circuits. As demonstrated herein, nearly two orders of magnitude suppression of phonon-mediated quasiparticle poisoning may be realized with the use of islands comprised of phonon downconversion material.

Discrete charge jumps due to particle impacts give rise to correlated dephasing errors in superconducting qubit arrays, and the need to mitigate such errors constrains the design of surface code arrays. However, for superconducting qubits, the correlated relaxation errors due to phonon-mediated quasiparticle poisoning resulting from these impacts are much more damaging. Around 90% of the energy of the impact event is transferred to the phonon reservoir in the substrate. Phonons propagate ballistically through the bulk substrate, transferring the energy of the impact event throughout the chip. Phonons interact with the superconducting groundplane and qubit structures, breaking Cooper pairs into quasiparticles that induce correlated relaxation and excitation errors. Due to the exponential dependence of the error threshold on the number of qubits to which the error couples, phonon-mediated quasiparticle poisoning is fatal for error correction in the surface code, unless mitigation steps are taken.

Islands formed of phonon downconversion material, which may also be referred to as reservoirs or phonon sinks, on a quantum processor promote rapid downconversion of pair-breaking phonons below the superconducting gap edge. These structures act as a phonon sink, preventing phonon-mediated quasiparticle poisoning over long distances. For optimal downconversion efficiency, a long electron mean free path is required. Suitably, the electron mean free path is on the order of hundreds of nm. In order to minimize the density of quasiparticles in the superconducting film, the thickness of the phonon downconversion material should be large compared to the thickness of the superconducting groundplane or device layer. Suitably, the thickness of the phonon downconversion material should be may be about two orders of magnitude larger than the groundplane thickness. By way of example, if the device layer and groundplane thicknesses are around 100 nm, the phonon downconversion material may be about 10 microns thick or more. As demonstrated herein, islands of Cu having a thickness on the order of 10 microns resulted in a factor 100 reduction in nonequilibrium quasiparticle density in the superconducting chip. The presence of these islands inhibit the propagation of energy released by particle impacts over long distance.

The islands may be formed by electrolytically plating, which may also be referred to as electroplating, a phonon downconversion material precursor onto a substrate having a qubit thereon. Electroplating results in a layer of electroplated phonon downconversion material being deposited on the substrate. The phonon downconversion material may be mechanically furrowed thereby creating furrows through the layer formed by the electroplated phonon downconversion material. This approach circumvents the need to pattern and etch the phonon downconversion material using lithography or chemical means (e.g., plasma etch) that would add cost and complexity to the qubit fabrication process and potentially degrade the quantum device layer.

Electroplating layers of phonon downconversion material allows for additional advantages to be realized over other methods for depositing the same material. Layers of phonon downconversion material can be grown much thicker than those formed using electroless chemical plating as needed for efficient phonon downconversion. Electroplating allows for the preparation of layers that are tens of microns or more whereas electroless chemical plating is limited to preparing layers on the order of microns. The electrical conductivity of the electroplated films is higher than those formed by electroless chemical plating. Higher electrical conductivity is advantageous and allows for more efficient phonon downconversion and longer electron mean free paths. Electroplated films also demonstrate more uniformity and have greater adhesion to the substrate than films prepared by electroless chemical plating.

FIG. 1 illustrates an exemplary quantum processor 100. As used herein, quantum processor refers to a device capable of being used to perform a quantum computation. Quantum processors exploit collective properties of quantum states, such as superposition or entanglement, to perform the quantum calculation. The quantum processor comprises one or more qubit structures 106 configured to prepare a qubit. In some embodiments, the qubit is a superconducting qubit, including phase, charge, or flux qubits. Exemplary qubits include transmon, Xmon, fluxonium, quantronium, and the like. The qubit structure may comprise one or more of a groundplane, lead, Josephson junction, channel structure, shunt capacitor, readout resonator, control line, bias line, airbridge, groundstrap for suppressing spurious microwave resonances and the like.

The qubit structure 106 is formed on a substrate 102. The substrate may be a semiconductor, such as Si. Exemplary embodiments include the use of a Si chip substrate. Substrates composed of other materials, such as sapphire, may also be used.

The quantum processor comprises a layer of electroplated phonon downconversion material 104. The electroplated phonon downconversion material 104 may be a normal metal or a low-gap superconductor. Cu is an exemplary metal but others, such as Ag or Au, may also be used. The low-gap superconductor should have a lower energy gap than a Josephson junction. Examples include In, Ta, Ti, or Mn-doped Al, but others may also be used.

Furrows 110 through the electroplated phonon downconversion material 104 define islands 112 coupled to the substrate and configured to channel deposited energy away from the qubit structure. As illustrated in FIG. 1, the island 112 is on the opposite surface of the substrate 102 relative to the qubit structure 106 but other relative orientations also allow for channeling deposited energy away from the qubit structure. For example, the islands and the qubit structure may be on the same surface of the substrate.

Furrows 110 may be formed into a regular lattice that define the islands. For example, the furrows may be formed into a square lattice, such as shown in the Example. Other regular lattices, such as rectangular, rhombic, hexagonal, and the like, may also be prepared. In other embodiments, the furrows are formed into an irregular lattice.

In the Example, the lattice spacing has 250 microns in both the horizontal and vertical directions but the lattice space need not be so limited. For example, the lattice spacing may be between about 10 microns to about 10 mm, about 10 microns to about 1 mm, or about 10 microns to 500 microns.

The width of the furrows may be determined by the mechanical means for preparing the furrows. In the Example, the lattice was prepared with a dicing saw blade having a width of 50 microns but the width of the furrow need not be so limited. For example, the width of the furrows may be between about 1 micron and about 500 microns or about 10 microns to about 100 microns.

The electroplated phonon downconversion material 104 should be selected to provide for efficient phonon downconversion. The approximate fraction of the energy spread between the islands 112 scales as the ratio of the relative heat capacities between the qubit structures 106 and the islands 112, i.e., this scales roughly as the relative volumes. In some embodiments, the electroplated phonon downconversion material 104 has a thickness of 10 microns or more. Suitably, the electroplated phonon downconversion material 104 has a thickness of 20, 30, 40, 50, 60, 70, 80, 90, or 100 microns or more.

To isolate islands 112 from each other, the furrows 110 should completely traverse the thickness of the electroplated phonon downconversion material 104. To ensure that the furrows 110 completely traverse the thickness of the electroplated phonon downconversion material 104, the furrows 110 may extend into the substrate 102.

The substrate may further comprise a seed layer. FIG. 1. illustrates an optional seed layer 108 positioned between the substrate 102 and the electroplated phonon downconversion material 104. The seed layer 108 may be used to improve adhesion of the electroplated phonon downconversion material 104 to the substrate 102 or the quality, such as conductivity or smoothness, of the electroplated phonon downconversion material 108. The seed layer may be deposited by an electroless process, such as electron beam evaporation.

In some embodiments, the seed layer 108 may comprise a bilayer formed from two different materials. Where a bilayer is used, the layer adjacent to the electroplated phonon downconversion material may be composed of the same material as the electroplated phonon downconversion material but it need not be. In the examples, the seed layer comprises 20 nm of Ti or Cr and 100 nm of Cu but the thickness of the layers or the choice of the materials need not be so limited.

Figure 2:
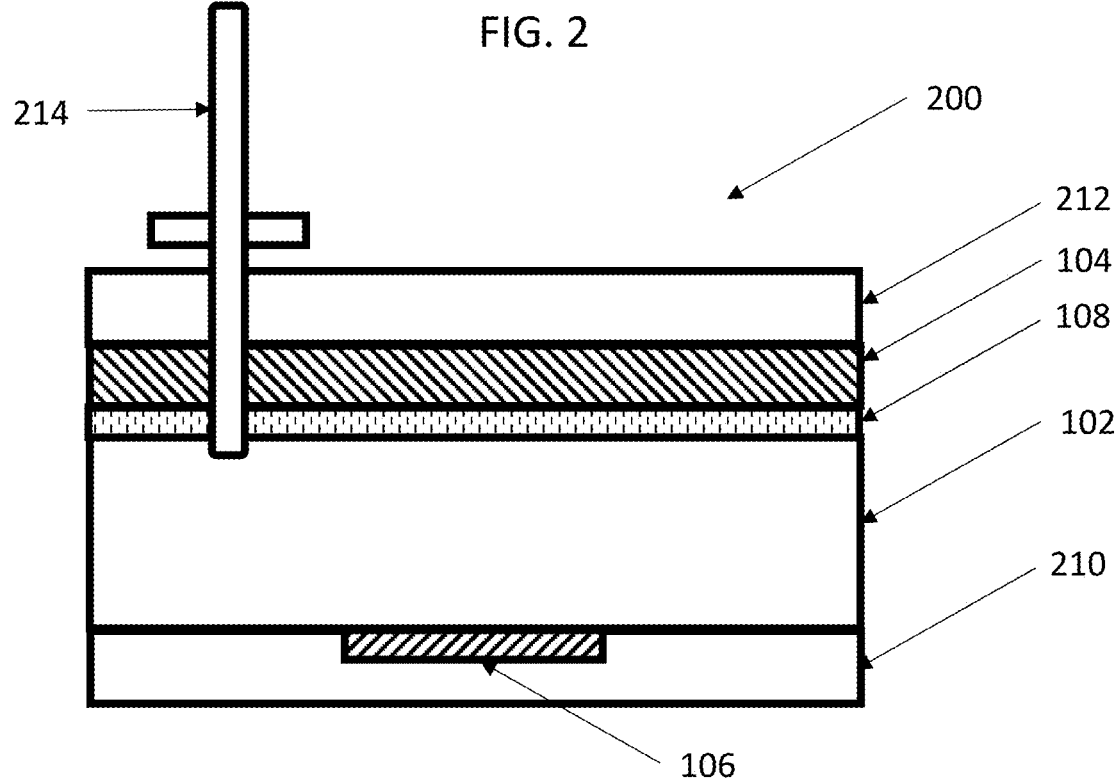
FIG. 2 illustrates a cross-section of an exemplary article for fabrication a quantum processor.

FIG. 2 illustrates an article 200 for fabricating the quantum processor described herein. As shown, the article 200 comprises the substrate 102, quantum structure 106, electroplated phonon downconversion material 104, and, optional seed layer 108 as described above. The article 200 further comprises furrowing protective layers 210 and 212. The furrowing protective layers 210 and 212 may be used to protect the processor components and materials during mechanical furrowing.

As shown in FIG. 2, a mechanical furrowing device 214, such as a dicing saw, may be used to furrow through the electroplated phonon downconversion material 104 and the seed layer 108. Other mechanical furrowing devices, such as an automated wafer scribe tool, may also be used. When using a mechanical furrowing device, detritus may foul or harm one or more components of the processor, such as a qubit structure, substrate, or electroplated phonon downconversion material. The furrowing protective layer minimizes the likelihood of such harm. The furrowing protective lay may be prepared from any material that may protect the processor and its components during furrowing and it should be removable. In the Example, a photoresist may be used as a furrowing protective barrier but it need not be so limited.

In some embodiments, an electroplating protective layer may be used. Such a layer may be used to protect a qubit structure 106 and/or substrate 102 prior to the electroplating the phonon downconversion material 104 onto the processor 100. The electroplating protective layer can be an insulator used to prevent electroplating of the phonon downconversion material 104 or a removable under layer that allows for removal of the phonon downconversion material 104 deposited thereon from regions where it is not wanted. The electroplating protective layer may remain on the article following electroplating and also be a furrowing protective layer. Optionally, the electroplating protective layer may be removed and different a furrowing protective layer may be deposited. In the Example, a photoresist may be used as an electroplating protective layer but it need not be so limited.

Although FIG. 2 illustrates a quantum structure 106 on the substrate 102, the quantum structure need not be present at the time of electroplating or mechanical furrowing. The substrate 102 may be configured for fabrication of one or more qubit structures after electroplating or mechanical furrowing is completed. In some embodiments, one or more of the qubit structures are patterned prior to electroplating, prior to mechanical furrowing but after electroplating, after mechanical furring and electroplating, or any combination thereof. By way of the Example provided, a qubit island, readout resonator, a groundplane, or any combination thereof may patterned prior to electroplating and a Josephson junction may be patterned after completion of mechanical furrowing. However, such qubit structures may be pattered at other times relative to electroplating and mechanical furrowing steps.

Figure 3:
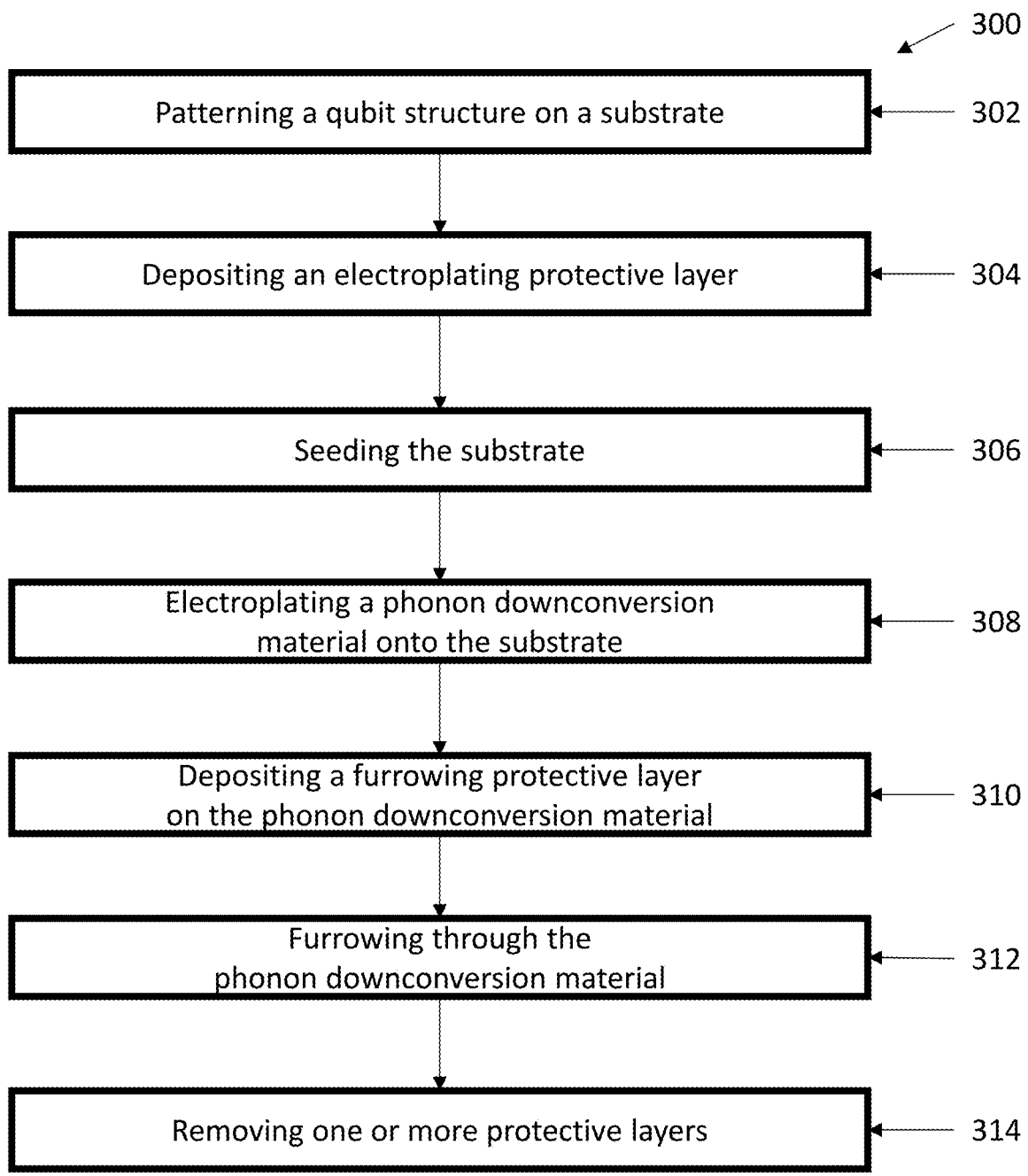
FIG. 3 illustrates an exemplary method for preparing a quantum processor.

FIG. 3 illustrates an exemplary method 300 for preparing a quantum processor. One or more qubit structures may be patterned onto a substrate according to methods known in the art 302. An electroplating protective layer may be deposited on the patterned qubit structure or the substrate 304. An optional seed layer may be seeded onto the substrate 306 after, or prior to, deposition of the electroplating protective layer.

Phonon downconversion material may be electroplated onto the substrate by applying electrical current to the substrate or optional seed layer while in contact with an electrolyte comprising a phonon downconversion material precursor 308. The phonon downconversion material precursor may be an ion that forms the phonon downconversion material under conditions sufficient to electroplate the phonon downconversion material. Metal cations may be reduced when a sufficient negative potential is applied to the substrate. For example, a metal precursor comprising Cu cations may be used to prepare a phonon downconversion material comprising metallic Cu.

Following electroplating of the phonon downconversion material, the phonon downconversion material may be mechanically furrowed 312. Prior to furrowing, the phonon downconversion material or qubit structure may be protected with a furrowing protective layer 310. Furrowing may be performed with any mechanical furrowing device, such as a dicing saw or automated wafer scribe tool, capable of selectively removing the phonon downconversion material and preparing the multiplicity of furrows necessary for defining the islands. If protective layers are used, the method may further comprise removal of those protective layers 314.

FIG. 3 indicates that patterning step 302 precedes depositing step 304. In some embodiments, the quantum processor substrate that undergoes electroplating and furrowing may have at least one or a complete complement of qubit structures for performing a quantum computation.

In some embodiments, two or more patterning steps at different stages of the method may be utilized to prepare the quantum processor. For example, one or more qubit structures may be patterned prior to depositing step 304 and one or more additional qubit structures may be patterned after electroplating step 308 or furrowing step 312. Accordingly, the quantum processor substrate that undergoes electroplating and furrowing may have one or more, but not a complete complement, of qubit structures for performing a quantum computation. Such a method may optionally include one or more additional patterning steps. For example, one or more of the qubit structures, such as a Josephson junction, shunt capacitor, readout resonator, control line, bias line, airbridge, groundstrap for suppressing spurious microwave resonances, or the like may be patterned on the substrate after electroplating and/or furrowing and other qubit structures, such as a qubit island, readout resonator, or groundplane, may be patterned on the substrate prior to electroplating.

In some embodiments, the electroplating protective layer may be deposited on a substrate configured for fabrication of a qubit structure thereon and lacking a qubit structure. In such an embodiment, one or more patterning steps 302 may be performed after electroplating but before furrowing and/or after furrowing.

Figure 4:
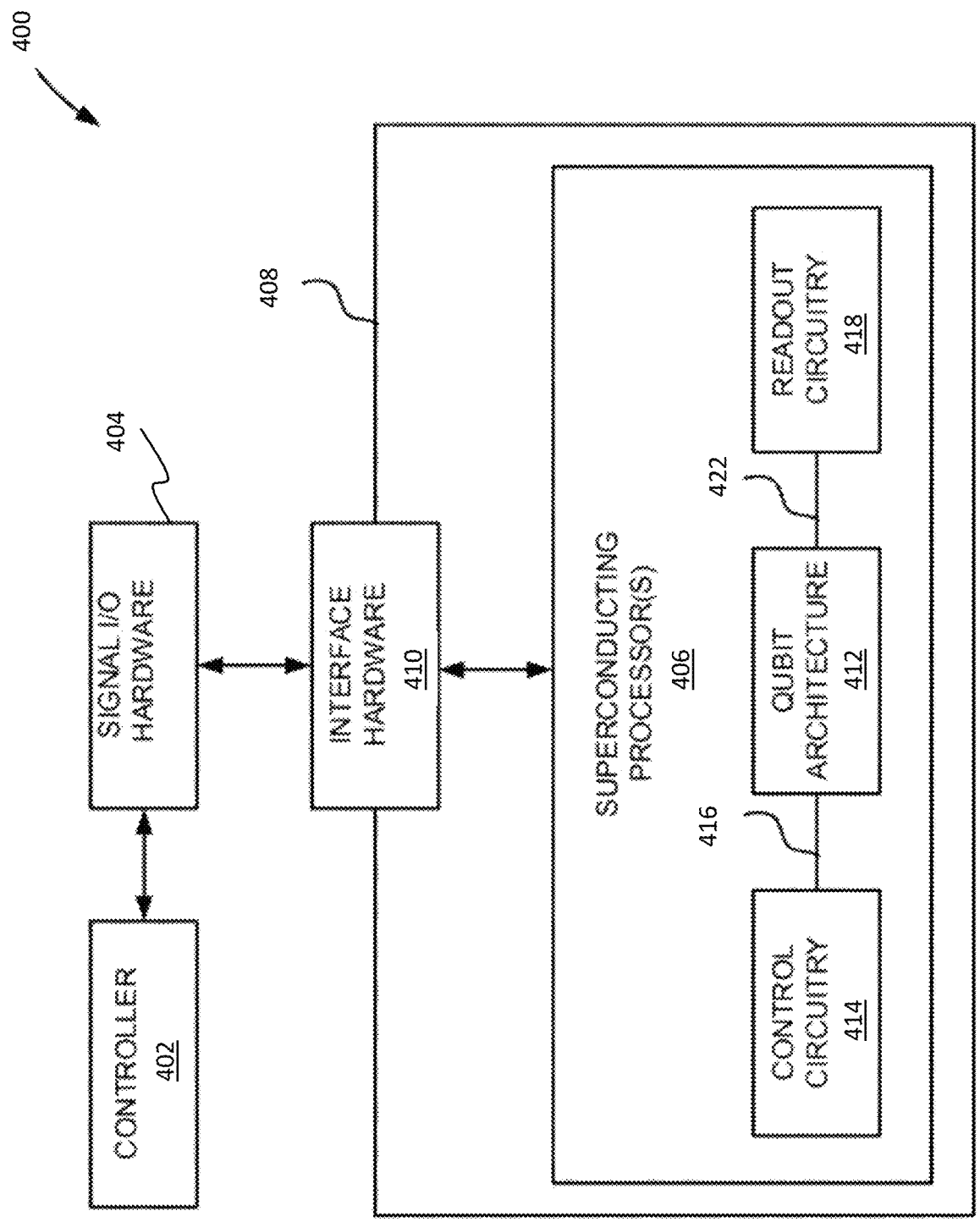
FIG. 4. Illustrates a schematic of a quantum computing system.

FIG. 4 illustrates an example system 400 for use in quantum information processing or quantum computation, in accordance with the present disclosure. In some embodiments, the system 400 may include a controller 402 and signal input/output (I/O) hardware 404 in communication with the controller 402. The system 400 may also include one or more superconducting processors 406 having electroplated phonon downconversion islands coupled to a substrate configured to channel deposited energy away from the qubit structure. These processors 406 may be contained in a housing unit 408, where the superconducting processor(s) 406 is (are) configured to perform a variety of quantum computations or quantum information processing. In addition, the system 400 may also include various interface hardware 410 for communicating and controlling signals between the signal I/O hardware 404 and the superconducting processor(s) 406.

The signal I/O hardware 404 may include various electronic systems, hardware and circuitry capable of a wide range of functionality. For example, the signal I/O hardware 404 may include various voltage sources, current sources, signal generators, amplifiers, filters, digitizers, mixers, multiplexers, voltmeters, digital/analog oscilloscopes, data acquisition cards, digital/analog signal controllers and/or processors, modulators, demodulators, logic blocks, and other equipment.

The controller 402 may direct the signal I/O hardware 404 to provide various signals to the superconducting processor(s) 406, as well as detect signals therefrom via the interface hardware 410. In some implementations, the controller 402 may also control various other equipment of the system 400, such as various pumps, valves, and so forth. In some aspects, the controller 402 may include a programmable processor or combination of processors, such as central processing units (CPUs), graphics processing units (GPUs), and the like. As such, the controller 402 may be configured to execute instructions stored in a non-transitory computer readable-media. In this regard, the controller 402 may be any computer, workstation, laptop or other general purpose or computing device. Additionally, or alternatively, the controller 402 may also include one or more dedicated processing units or modules that may be configured (e.g. hardwired, or pre-programmed) to carry out steps, in accordance with aspects of the present disclosure.

The housing unit 408 is configured to control the environment to which the superconducting processor(s) 406 is (are) exposed. For instance, the housing unit 408 may include various components and hardware configured to control the temperature of the superconducting processor(s) 406, as well as the liquid and/or gas mixture surrounding the superconducting processor(s) 406. In addition, the housing unit 408 may also be configured to control external noise signals, such as stray electromagnetic signals. To this end, the housing unit 408 may include various shielding units and filters. By way of example, the housing unit 408 may include, or be part of, a dilution refrigerator, or other low-temperature system or cryostat, that is capable of operating over a broad range of temperatures, including temperatures less than the critical temperature of the superconductor materials in the superconducting processor(s) 406 (e.g., temperatures less than 4 Kelvin).

The interface hardware 410 provides a coupling between the signal I/O hardware 404 and the superconducting quantum processor(s) 406, and may include a variety of hardware and components, such as various cables, wiring, RF elements, optical fibers, heat exchangers, filters, amplifiers, attenuators, local oscillators, waveform generators, converters, mixers, stages, and so forth.

As shown in FIG. 4, the quantum processor(s) 406 described herein may include a qubit architecture 412 connected to control circuitry 414 by way of various control coupling(s) 416. The qubit architecture 412 may include any number of qubits configured in any manner. In some implementations, the qubit architecture 412 may include one or more transmon qubits. However, the qubit architecture 412 may include other qubit types.

The control circuitry 414 may be in communication with the signal I/O hardware 404, and configured to control qubits in the qubit architecture 412 by providing various control signals thereto. In some implementations, the control circuitry 414 includes a microwave driver that is coupled to the qubit architecture 412. For purposes of illustration, a microwave driver, frequency tuning hardware, or biasing hardware may be coupled to a qubit-readout resonator pair. The microwave driver may be configured to generate and provide a microwave drive frequency to control qubits or prepare cavity pointer states in the qubit architecture 412. The frequency tuning hardware may be configured to apply a current, voltage, or the like or biasing hardware may be configured to generate and provide a flux to bias the qubit. This may be accomplished by way of the signal I/O hardware 404, which as directed by the controller 402, may initiate and control the timing, intensity and repetition of microwave drive frequency provided by the microwave driver or a current, voltage, or flux for biasing the components of the qubit system, such as the qubit or readout resonator.

Other example control signals directed by the control circuitry 414 to the qubit architecture 412 may also include microwave irradiation signals, current signals, voltage signals, flux signals, and so on. To this end, the control circuitry 414 may include various other circuitry, including any number of linear and non-linear circuit elements, such as Josephson junctions, inductors, capacitors, resistive elements, superconductive elements, transmission lines, waveguides, gates, and the like.

The control couplings 416 providing a communication between the qubit architecture 412 and control circuitry 414 may be configured to transmit, modulate, amplify, or filter the pulse sequence generated using the control circuitry 414. Such control couplings 416 may include various circuitry, including capacitive or inductive elements, passive superconducting microstrip lines, active Josephson transmission lines, including any number of Josephson junctions, and so forth.

Referring again to FIG. 4, the qubit architecture 412 may also be connected to readout circuitry 418 via readout coupling(s) 422. The readout circuitry 418 may be configured to perform readout on qubits in the qubit architecture 412, and provide corresponding signals to the signal I/O hardware 404. As non-limiting examples, the readout circuitry 418 may include various resonant cavities, logic circuits, as well as any number of linear and non-linear circuit elements, such as Josephson junctions, inductors, capacitors, resistive elements, superconductive elements, transmission lines, waveguides, gates, and the like. In some aspects, the controller 402 may direct the signal I/O hardware 404 to provide signals for modulating or tuning the control couplings 416 and/or readout couplings 422.

The control couplings 416 and/or readout couplings 422 may be designed such that nonequilibrium quasiparticles generated in the control circuitry 414 or readout circuitry 418 are isolated from the qubit architecture 412 in a manner intended to avoid the introduction of degrees of freedom leading to quantum decoherence. For example, quasiparticle poisoning can be mitigated by avoiding direct galvanic connection between the signal and ground traces of the qubit architecture 412 and the control circuitry 414 and/or readout circuitry 418.

The presently disclosed technology allows for fabrication of islands composed of phonon downconversion material being without the need to pattern and etch the phonon downconversion material using lithography or chemical means. This avoids added cost, complexity, and the danger associated with processing steps that might potentially degrade the quantum device layer. Electroplating also allows for thick layers of high quality and electrical conductivity to be grown that allows for high conversion efficiency.

Unless otherwise specified or indicated by context, the terms "a", "an", and "the" mean "one or more." For example, "a molecule" should be interpreted to mean "one or more molecules."

As used herein, "about", "approximately," "substantially," and "significantly" will be understood by persons of ordinary skill in the art and will vary to some extent depending on the context in which they are used. If there are uses of the term which are not clear to persons of ordinary skill in the art given the context in which it is used, "about" and "approximately" will mean plus or minus ≤10% of the particular term and "substantially" and "significantly" will mean plus or minus ≥10% of the particular term.

As used herein, the terms "include" and "including" have the same meaning as the terms "comprise" and "comprising." The terms "comprise" and "comprising" should be interpreted as being "open" transitional terms that permit the inclusion of additional components further to those components recited in the claims. The terms "consist" and "consisting of" should be interpreted as being "closed" transitional terms that do not permit the inclusion additional components other than the components recited in the claims. The term "consisting essentially of" should be interpreted to be partially closed and allowing the inclusion only of additional components that do not fundamentally alter the nature of the claimed subject matter.

All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

All references, including publications, patent applications, and patents, cited herein are hereby incorporated by reference to the same extent as if each reference were individually and specifically indicated to be incorporated by reference and were set forth in its entirety herein.

Preferred aspects of this invention are described herein, including the best mode known to the inventors for carrying out the invention. Variations of those preferred aspects may become apparent to those of ordinary skill in the art upon reading the foregoing description. The inventors expect a person having ordinary skill in the art to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

EXAMPLES

Figure 5:
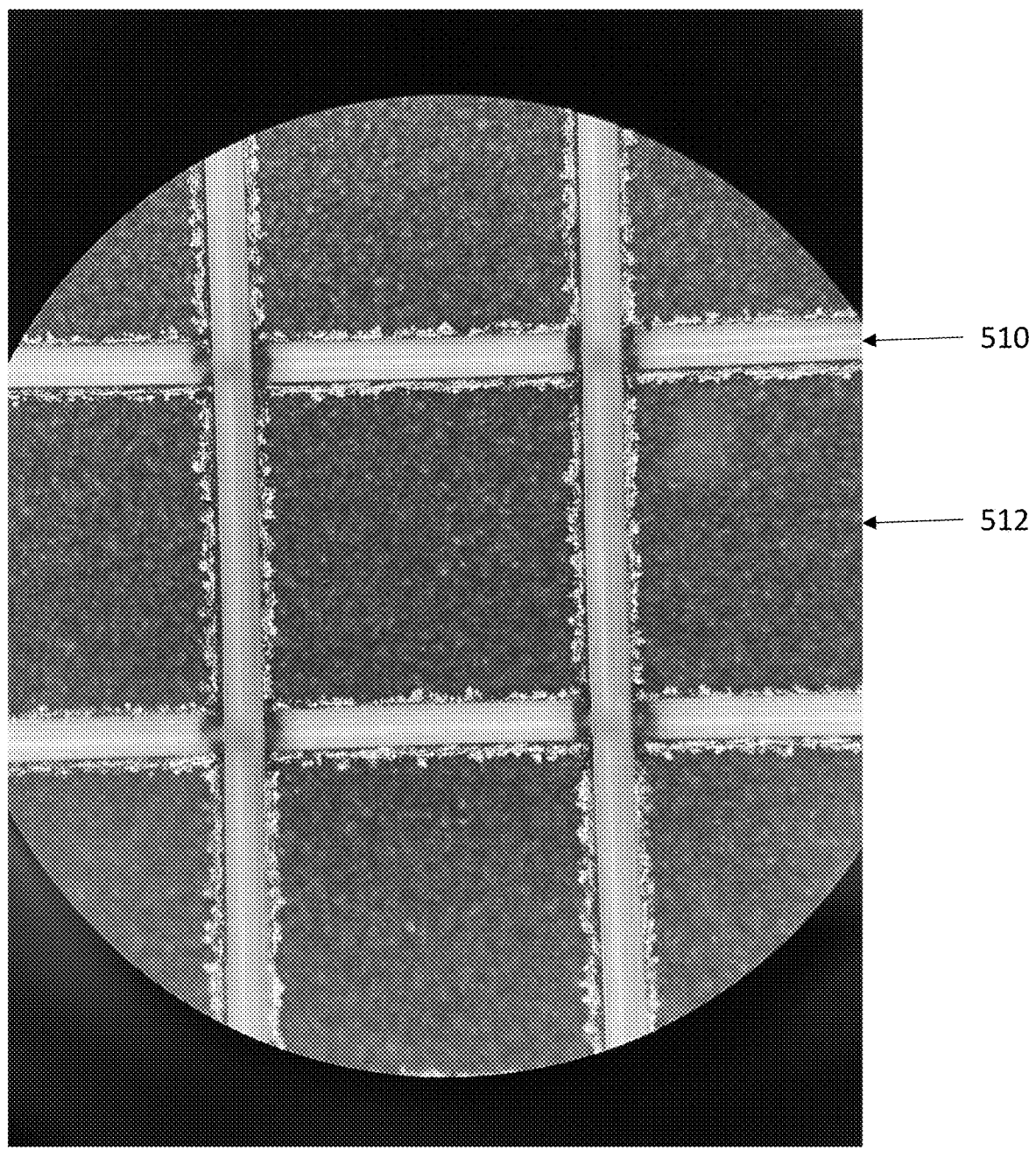
FIG. 5 photographically illustrates an exemplary wafer comprising a superconducting qubit and Cu islands prepared according to the disclosed methods.

Superconducting qubit devices with backside Cu islands for downconversion of hot phonons were fabricated as follows. A double-side polished, high-resistivity 4" Si wafer was cleaned and etched with HF to remove native oxide. 60 nm of Nb was sputter-deposited on the top side of the wafer. Qubit islands, readout resonators, and groundplane were patterned with standard photolithographic definition followed by reactive ion etching of the Nb. After stripping the resist pattern, a photoresist film was spun on the top side of the wafer to protect the Nb features during the Cu island processing on the wafer backside. A seed layer was deposited on the back side of the wafer using electron-beam evaporation of 20 nm of Ti and 100 nm of Cu. Using a Cu electroplating process, a roughly 10-micron thick film of Cu was deposited on top of the seed layer on the back side of the wafer. A thick photoresist film was spun on top of the electroplated Cu layer on the wafer backside to protect the Cu surface during the subsequent dicing saw definition of the islands. To pattern the Cu film into islands, instead of a lithographic process, furrows into the back side of the wafer were made with a dicing saw. By using a dicing saw blade with a 50-micron width, a lattice of approximately 20-micron deep furrows on the wafer backside that went through the Cu and into the Si was made. The lattice spacing was 250 microns in the horizontal and vertical directions, leaving square islands that were 200 microns on a side, with 50 micron gaps between islands. Following furrowing, the protective photoresist from both sides of the wafer was stripped off. Standard electron-beam resist was spun onto the wafer for defining the Josephson junctions. Electron-beam lithography was used to define the Josephson junctions for the qubits, followed by a liftoff process of double-angle shadow-evaporation of Al—AlOx-Al junctions to complete the qubits. A photographic image of the device obtained through a microscope objective is presented in FIG. 5 comprised of furrows 510 and islands 512 defined by the furrows.

Suppression of phonon-mediated quasiparticle poisoning was determined by a side-by-side comparison of qubit devices fabricated with and without the electroplated phonon downconversion structures described in this disclosure. By injecting quasiparticles in a controlled fashion using superconductor-insulator-superconductor junctions fabricated at the edge of the qubit chips, we explored the dependence of qubit energy relaxation time, excess population of the qubit excited state, and quasiparticle parity switching rate on the voltage bias of the injector junction, which controls the energy and injection rate of quasiparticles. Quasiparticles recombine at or near the injection point, emitting pair-breaking phonons that propagate through the substrate, inducing quasiparticle poisoning of remote qubits . . . . The exemplary device incorporating phonon downconversion structures demonstrated nearly two orders of magnitude suppression of phonon-mediated quasiparticle poisoning in comparison to the reference device without phonon downconversion structures.

We claim:

1. A quantum processor comprising a substrate, a qubit structure formed on the substrate, a phonon downconversion material, and furrows through the phonon downconversion material forming a plurality of phonon downconversion islands coupled to the substrate configured to channel deposited phonon energy away from the qubit structure,
   wherein the phonon downconversion material is a normal metal or a superconductor having a lower energy gap than the superconductor used to form a Josephson junction in the quantum processor.

2. The quantum processor of claim 1, wherein the furrows are formed by mechanical furrowing through the phonon downconversion material.

3. The quantum processor of claim 1 further comprising a seed layer positioned between the substrate and the phonon downconversion material.

4. The quantum process of claim 3, wherein the furrows are formed by mechanical furrowing through the phonon downconversion material and the seed layer.

5. The quantum processor of claim 3, wherein the seed layer comprises a bilayer of two different materials, wherein the layer adjacent to the phonon downconversion material is composed of the same material as the phonon downconversion material.

6. The quantum processor of claim 1, wherein the phonon downconversion material is an phonon downconversion material, or is deposited on the substrate by vacuum sputtering or evaporation.

* * * * *

UNITED STATES PATENT AND TRADEMARK OFFICE
CERTIFICATE OF CORRECTION

| | | |
|---|---|---|
| PATENT NO. | : 12,414,483 B2 | Page 1 of 1 |
| APPLICATION NO. | : 17/469380 | |
| DATED | : September 9, 2025 | |
| INVENTOR(S) | : Robert McDermott et al. | |

It is certified that error appears in the above-identified patent and that said Letters Patent is hereby corrected as shown below:

In the Claims

Claim 6, Column 11, Line 7, "an phonon downconversion material" should be --an electroplated downconversion material--.

Signed and Sealed this
Seventh Day of October, 2025

John A. Squires
*Director of the United States Patent and Trademark Office*